United States Patent
Goto et al.

(10) Patent No.: US 7,446,060 B2
(45) Date of Patent: *Nov. 4, 2008

(54) THIN-FILM FORMING METHOD USING SILANE AND AN OXIDIZING GAS

(75) Inventors: Masashi Goto, Yokohama (JP); Kazufumi Azuma, Yokohama (JP); Yukihiko Nakata, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/619,508

(22) Filed: Jan. 3, 2007

(65) Prior Publication Data

US 2007/0105402 A1 May 10, 2007

Related U.S. Application Data

(62) Division of application No. 10/821,843, filed on Apr. 12, 2004, now Pat. No. 7,307,028.

(30) Foreign Application Priority Data

Apr. 18, 2003 (JP) ............................. 2003-114640
Mar. 29, 2004 (JP) ............................. 2004-095559

(51) Int. Cl.
*H01L 21/31* (2006.01)

(52) U.S. Cl. ............................. 438/788; 257/E21.278

(58) Field of Classification Search ........................ None
See application file for complete search history.

(56) References Cited

U.S. PATENT DOCUMENTS

2002/0187656 A1* 12/2002 Tan et al. ..................... 438/788

FOREIGN PATENT DOCUMENTS

| | | |
|---|---|---|
| CN | 1156897 A | 8/1997 |
| CN | 1336010 A | 2/2002 |
| JP | 11-279773 | 10/1999 |

OTHER PUBLICATIONS

U.S. Appl. No. 10/821,843, filed Apr. 12, 2004, which is co-pending.*

M. Goto, et al. "Surface Wave Plasma Oxidation at Low Temperature for Gate Insulator of Poly-Si TFTs," Proceedings of The Ninth International Display Workshops, Dec. 4-6, 2002, pp. 355-358.

Reiji Morioka, et al, "Deposition of High-$_K$ Zirconium Oxides in VHF Plasma-Enhanced CVD Using Metal-Organic Precursor", Collection of Lecture Documents of the "20$^{th}$ Plasma Processing Research Meeting" sponsored by Plasma Electronics Branch of Applied Physics Institute, Jan. 29, 2003, pp. 317-318.

M. Goto, et al, The Japan Society of Applied Physics, "Surface Wave Plasma Oxidation at Low Temperature Under Rare Gas Dilution", 2003, vol. 42, Part 1, No. 11, pp. 7033-7038.

* cited by examiner

*Primary Examiner*—Scott B. Geyer
(74) *Attorney, Agent, or Firm*—Oblon, Spivak, McClelland, Maier & Neustadt, P.C.

(57) ABSTRACT

Disclosed is a film-forming method, comprising supplying into a plasma processing chamber at least three kinds of gases including a silicon compound gas, an oxidizing gas, and a rare gas, the percentage of the partial pressure of the rare gas (Pr) based on the total pressure being not smaller than 85%, i.e., $85\% \leq Pr < 100\%$, and generating a plasma within the plasma processing chamber so as to form a film of silicon oxide on a substrate to be processed.

2 Claims, 5 Drawing Sheets

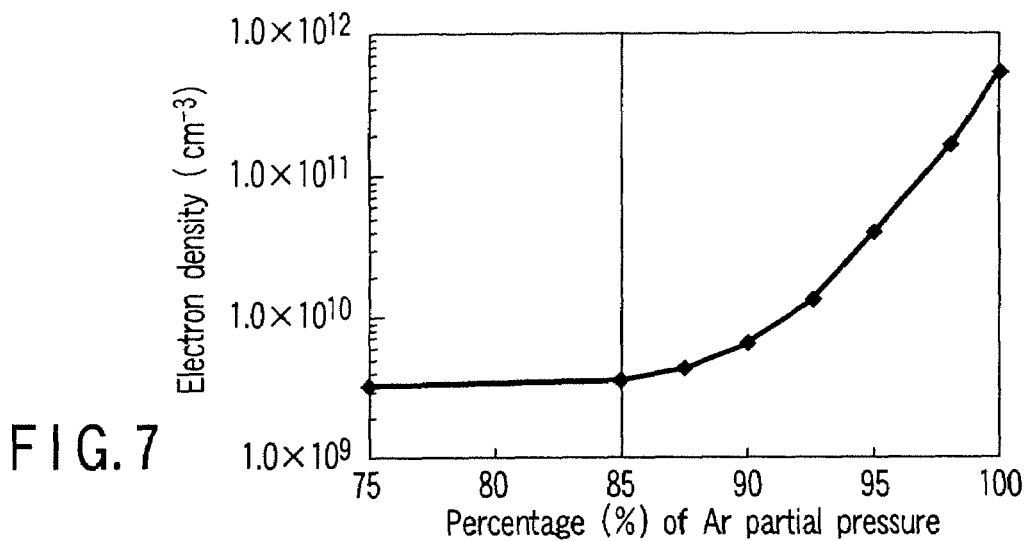
F I G. 7
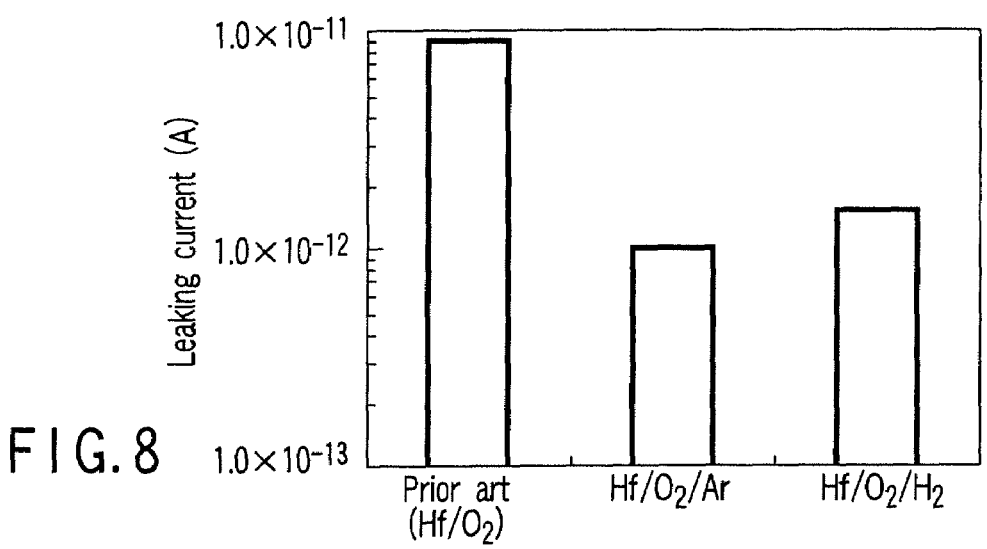
F I G. 8
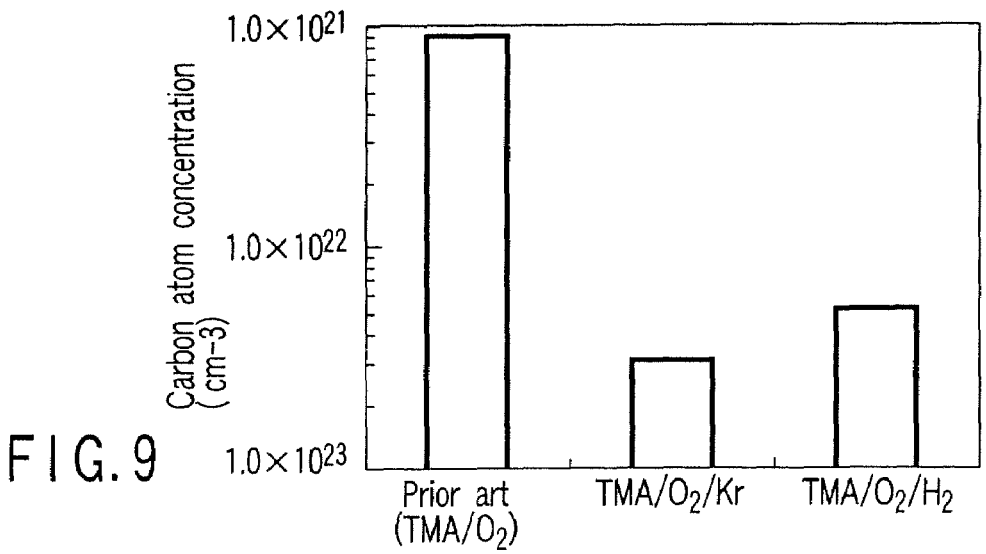
F I G. 9

THIN-FILM FORMING METHOD USING SILANE AND AN OXIDIZING GAS

CROSS-REFERENCE TO RELATED APPLICATIONS

This application is based upon and claims the benefit of priority from prior Japanese Patent Applications No. 2003-114640, filed Apr. 18, 2003; and No. 2004-095559, filed Mar. 29, 2004, and is a divisional of U.S. application Ser. No. 10/821,843, filed Apr. 12, 2004, the entire contents of each of which are incorporated herein by reference.

BACKGROUND OF THE INVENTION

1. Field of the Invention

The present invention relates to a method of forming a film used in a semiconductor device such as a semiconductor integrated circuit device or a display device such as a liquid crystal display device. The present invention also relates to a method of manufacturing a semiconductor device such as a thin film transistor (TFT) or a metal oxide semiconductor device (MOS device) and to a semiconductor device. The present invention further relates to a method of manufacturing a display device such as a liquid crystal display device, an organic EL display device or an inorganic EL display device, and to a display device.

2. Description of the Related Art

In general, a silicon oxide film is used as a gate insulating film in a semiconductor device such as a thin film transistor (TFT). A plasma CVD (plasma enhanced chemical vapor deposition) method is known to the art as a method of forming a silicon oxide film under temperatures not higher than 600° C. so as to prevent adverse effects on the substrate.

In the plasma CVD method, a silicon oxide film is formed as follows. In the first step, a monosilane gas is mixed with an oxygen gas, followed by supplying the mixed gas into a chamber in which a substrate is arranged. Under this condition, a plasma is generated within the chamber so as to achieve the plasma discharge of the monosilane gas and the oxygen gas, thereby depositing silicon oxide on the substrate.

The conventional plasma CVD method gives rise to the problem that the oxygen atoms are not supplied sufficiently, with the result that formed is a silicon oxide film having a large oxygen deficiency. Naturally, it is of high importance to overcome the problem.

Also, proposed in patent document e.g., Japanese Patent Disclosure (Kokai) No. 11-279773, is a plasma CVD method using a mixed gas consisting of two kinds of gases including gaseous molecules and a rare gas having appropriate excitation levels relative to the gaseous molecules.

It should be noted that, in a top gate type TFT used in a display device, silicon oxide is deposited in general by a plasma CVD method on a semiconductor layer processed in the form of an island and having a thickness of about 50 nm so as to form a gate insulating film having a thickness of 80 to 100 nm.

The scale of the display device has been enlarged, and the display device has been made to perform many functions. In this connection, the TFT has come to be applied to a new display device such as an organic EL display device. Such being the situation, miniaturization of the TFT has come to be required while improving the device characteristics of the TFT. In order to miniaturize the TFT, the gate insulating film is required to be rendered thinner. To be more specific, when it comes to a TFT having a channel length of 1 nm, it is required for the thickness of the gate insulating film to be decreased to 30 nm.

When it comes to a top gate type TFT in which a gate insulating film is formed on a semiconductor layer formed in the shape of an island, it is necessary for the gate insulating film to be formed in a manner to cover the entire region of the semiconductor layer including the stepped portion formed in the semi-conductor layer. It follows that the current leakage through the gate insulating film tends to be increased in the stepped portion. It should be also noted that the amount of leak current will increase of the gate insulating if the gate insulating film is made of an oxide silicon film that is as thin as 30 nm.

One approach to solve the above problems is to use a laminated structure of plasma CVD films, as seen in the documents 1 and 2 set forth below.

According to the technology disclosed in document 1 referred to above, it is possible to form a film under the temperature lower than that required in the organometallic gaseous phase growth method while suppressing the damage done to the underlayer. In addition, the film can be formed at a film-forming rate higher than that for the atomic layer depositing method. However, the zirconium oxide film formed by the technology disclosed in document 1 gives rise to the problem that the oxygen deficiency in the formed film is significantly large.

Document 1: M. Goto, et al., "Surface Wave Plasma Oxidation at Low Temperature for Gate Insulator of Poly-Si TFTs", Dec. 4-6, 2002, [Proceedings of The Ninth International Display Workshops], p 355 to p 358.

Document 2: "Formation of Zirconium Oxide Film having High Dielectric Constant by Plasma CVD using Organometallic Material as Precursor" by Reiji Morioka, et al., p 317 to p 318 of the collection of lecture documents of the "20$^{th}$ Plasma Processing Research Meeting" held on Jan. 29, 2003 and sponsored by Plasma Electronics Branch of Applied Physics Institute (an incorporated body).

As described above, if the thickness of the gate insulating film is decreased to about 30 nm, it is difficult to obtain sufficient device characteristics. In other words, the decrease in the thickness of the silicon oxide film is limited. Such being the situation, the metal oxides having a dielectric constant higher than that of silicon oxide such as hafnium oxide and zirconium oxide have come to attract attention as a material of the gate insulating film. In other words, in the case of using a metal oxide having a high dielectric constant as a material of a gate insulating film, it is expected that the thickness of the gate insulating film can be further decreased while maintaining the capacitance of the gate insulating film equal to that of the gate insulating film formed of a silicon oxide film.

An organometallic gaseous phase growth method (MOCVD method), a sputtering method or an atomic layer depositing method (Atomic Layer Deposition: ALD) as a deposition method of a very thin film are known to the art as a method of forming a film made of a metal oxide such as hafnium oxide or zirconium oxide.

In the organometallic gaseous phase growth method, a film is grown by decomposing an organometallic compound gas used as a raw material by using the substrate heated to 500° C. to 700° C., with the result that it is difficult to form a metal oxide film on a general type of glass substrate or a plastic substrate.

A film can be formed at a relatively low temperature in the case of employing the sputtering method. However, since particles running at a high speed collide against the substrate in the case of employing the sputtering method, the underlayer film tends to be damaged. It follows that the metal oxide film formed by the sputtering method has a high interface state density and, in addition, involves a significant oxygen deficiency. Incidentally, in order to make up for the oxygen deficiency in the metal oxide film, it is necessary to employ, for example, a plasma processing or an annealing treatment under high temperatures after the film formation. It follows that the number of manufacturing processes needed in the formation of the metal oxide film is increased, which is disadvantageous.

In the atomic layer depositing method, the atomic layers are deposited one layer at a time and, thus, the film-forming rate is very low. It follows that the atomic layer deposition method is not adapted for the formation of a TFT because it is necessary for the gate insulating film included in the TFT to have a thickness of tens of nanometers.

A film-forming method employing a plasma CVD technology using an organometallic material as a precursor is proposed as another method of forming a metal oxide film. The particular film-forming method is summarized below.

In the first step, tetrapropoxy zirconium ($Zr(OC_3H_7)_4$) is mixed with an oxygen gas and an argon gas. The ratio of the oxygen gas to the argon gas within the mixed gas is 1:5. In other words, the percentage of the partial pressure of the argon gas based on the total pressure of the mixed gas is 80%. Then, the mixed gas is introduced into a chamber in which a substrate is arranged. Under this condition, a plasma is generated within the chamber so as to achieve a plasma discharge of the tetrapropoxy zirconium and the oxygen gas, thereby depositing zirconium oxide on the substrate.

In the technology disclosed in document 1 referred to previously, two kinds of gases consisting of gaseous molecules and a rare gas having an appropriate excitation state relative to the gaseous molecules are mixed so as to permit the rare gas to decompose the gaseous molecules into an atomic state. In other words, in the case of forming a silicon oxide film, a monosilane gas is mixed with an argon gas so as to generate the atomic silicon and, at the same time, an oxygen gas is mixed with a xenon gas so as to generate the atomic oxygen. It follows that, in the technology disclosed in document 1, at least two plasma generating apparatuses are required for forming a silicon oxide film or a metal oxide film. Such being the situation, the manufacturing apparatus is rendered complex and the manufacturing price is increased. In addition, the technology disclosed in patent document 1 gives rise to the problem that it is impossible to use a gas consisting of an organic silicon compound such as tetraethoxy silane (TEOS) as gaseous molecules for generating the silicon atoms.

Further, document 2 pointed out above refers to, for example, the relationship between the Kr dilution ratio and the film thickness owing to the plasma oxidation and to the relationship between the microwave output and the oxygen atom density. However, document 2 simply refers to the technology of performing a surface wave plasma oxidation at a low temperature for forming a gate insulating film for a TFT, failing to refer to, for example, the film-forming technology as in the present invention.

BRIEF SUMMARY OF THE INVENTION

An object of the present invention is to provide a film-forming method that permits forming a film having a low oxygen deficiency, a method of manufacturing a semiconductor device, a semiconductor device, a method of manufacturing a display device, and a display device.

According to a first aspect of the present invention, there is provided a film-forming method, comprising:

supplying into a plasma processing chamber at least three kinds of gases including a silicon compound gas (or an organometallic compound gas), an oxidizing gas, and a rare gas, the percentage of the partial pressure of the rare gas (Pr) based on the total pressure of all the gases being not smaller than 85%, i.e., $85\% \leq Pr < 100\%$; and generating a plasma within the plasma processing chamber so as to form a film of silicon oxide (or metal oxide) on a substrate to be processed.

According to a second aspect of the present invention, there is provided a film-forming method, comprising:

supplying into a plasma processing chamber at least three kinds of gases including a silicon compound gas (or an organometallic compound gas), an oxidizing gas, and a hydrogen gas; and generating a plasma within the plasma processing chamber so as to form a film of silicon oxide (or metal oxide) on a substrate to be processed.

According to a third aspect of the present invention, there is provided a semiconductor device, comprising a transistor including at least one film selected from the group consisting of the silicon oxide film and the metal oxide film formed by the film-forming method given above. The semiconductor device can be formed as a display device. As a result, the semiconductor device which has a small current leakage can be obtained.

BRIEF DESCRIPTION OF THE SEVERAL VIEWS OF THE DRAWING

FIG. 7 is a graph showing the relationship between the percentage of the partial pressure of the Ar gas contained in a mixed gas and the electron density in the mixed gas;

FIG. 8 is a graph showing the current leakage through a $HfO_2$ film formed by the conventional film-forming method, through a $HfO_2$ film formed by the film-forming method according to a fourth embodiment of the present invention, and through a $HfO_2$ film formed by the film-forming method according to a fifth embodiment of the present invention;

FIG. 9 is a graph showing a carbon atom concentration in an $Al_2O_3$ film formed by the conventional method, in an $Al_2O_3$ film formed by the method according to a sixth embodiment of the present invention, and in an $Al_2O_3$ film formed by the method according to a seventh embodiment of the present invention;

DETAILED DESCRIPTION OF THE INVENTION

The present invention will now be described in detail.

Figure 1:
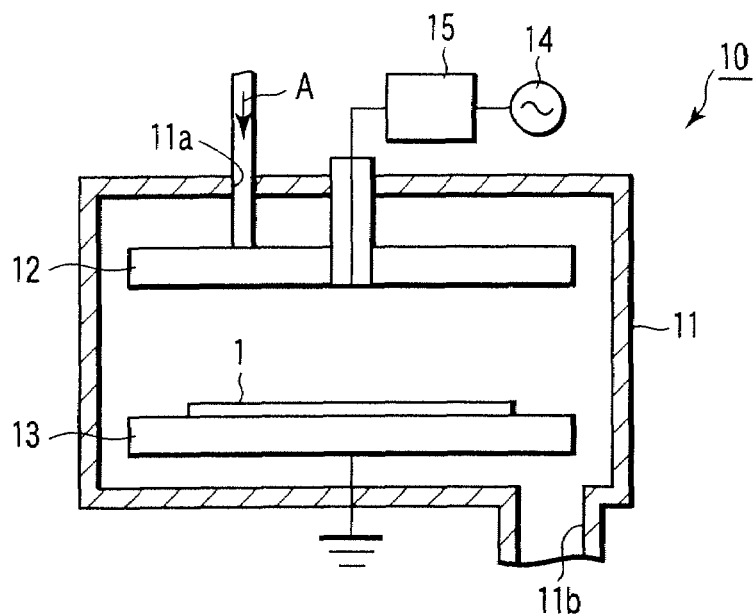
FIG. 1 schematically shows the construction of a plasma CVD apparatus used in the film-forming method according to each of first to third embodiments of the present invention.

Described first is a plasma CVD apparatus (plasma enhanced chemical vapor deposition system) 10 shown in FIG. 1, which is one of the chemical gaseous phase film-forming apparatuses for working the film-forming process. The plasma CVD apparatus 10 shown in FIG. 1 is, for example, a parallel flat plate type plasma CVD apparatus. As shown in FIG. 1, the apparatus 10 comprises, for example, a chamber 11 used as a plasma processing chamber, and a pair parallel flat plate type electrodes 12 and 13 arranged to face each other in the chamber 11. A high frequency power supplying circuit, for example, high frequency power source apparatus 14 for applying high frequency power of 500 W (output power) and 40 MHz (frequency) to electrode 12 is connected to the electrode (upper electrode) 12 via a matching device 15.

The chamber 11 in which is housed a substrate 1 to be processed is a vacuum chamber consisting of, for example, a metal container providing a hermetic inner region. A gas inlet pipe 11a hermetically penetrates an upper portion of the chamber 11. A tip of the gas inlet pipe 11a is connected to a shower electrode, which functions as the upper electrode 12 as well. A mixed gas from the shower electrode is uniformly emitted onto the surface of the substrate to be processed. A gas evacuation portion 11b is formed in a bottom portion of the chamber 11. A mixed gas used as a film-forming process gas is introduced from the gas inlet portion 11a into the chamber 11 through the electrode 12 of a shower electrode structure as denoted by an arrow A in FIG. 1. A vacuum exhaust system (not shown) using, for example, a turbo molecular pump is connected to the gas evacuation portion 11b. The chamber 11 is evacuated by operating the vacuum exhaust system until a prescribed degree of vacuum is reached within the chamber 11.

The output terminal of the high frequency power source apparatus 14 for producing a high frequency power used for generating a plasma is connected through the matching device 15 for controlling the load to one of the pair of electrodes 12 and 13 positioned to face each other. In the example shown in the drawing, the output terminal of the high frequency power source apparatus 14 is connected to one of the electrodes 12 and 13, e.g., to the upper electrode 12, with the other electrode 13 connected to the ground potential point.

A stage for supporting the substrate 1 to be processed is arranged within the chamber 11. In the apparatus shown in the drawing, the lower electrode 13 also acts as the stage for supporting the substrate 1. A heating means (not shown) for heating the substrate 1 to be processed such as a heater or a lamp anneal is arranged within the stage (electrode 13).

The plasma CVD apparatus 10 is constructed such that the high frequency power source apparatus 14 is operated after the chamber 11 is evacuated so as to apply a high frequency power between the electrodes 12 and 13 through the matching device 15. Under this condition, a process gas is supplied into the chamber 11 so as to produce a plasma within the chamber 11. A heater is provided for the gas inlet pipe 11a or the wall of the chamber 11 in case of need. The temperature of the heater is controlled so as not to form a film on the gas inlet pipe 11a or the wall of the chamber 11.

The film-forming method using the apparatus shown in FIG. 1 will now be described.

First Embodiment

In the first step, a substrate 1 to be processed is prepared. The substrate 1 to be processed includes, for example, a silicon substrate for manufacturing a semiconductor device, a glass substrate for forming a display circuit of a liquid crystal display device, or a plastic substrate. In the first embodiment, the substrate to be processed is formed of, for example, a silicon substrate.

In the next step, prepared is a mixed gas consisting of at least three kinds of gases including a silicon compound gas formed of a compound having silicon (Si) atoms, an oxidizing gas, and a rare gas. Incidentally, it is possible to mix the silicon compound gas, the oxidizing gas and the rare gas in the process of introducing these gases into the chamber 1 so as to form the desired mixed gas.

In the first embodiment of the present invention, the mixed gas is prepared by mixing a tetraethoxy silane ($Si(OCH_2CH_3)_4$: tetra ethyl ortho silicate) gas, i.e., TEOS gas, used as a silicon compound gas or an organometallic compound gas, an oxygen gas ($O_2$ gas) used as an oxidizing gas, and a xenon gas (Xe gas) used as a rare gas. The mixing ratio of the TEOS gas to the $O_2$ gas in the mixed gas is 1:5. Where the total pressure of the mixed gas is set at 100%, the percentage (diluting rate) of the partial pressure of the Xe gas (Pr) is set at a level not smaller than 85%, i.e., 85%≦Pr<100%. For example, the percentage Pr noted above is set at 90%.

In the next step, the substrate 1 to be processed is housed in the chamber 11 of the plasma CVD apparatus 10 shown in FIG. 1, followed by operating the vacuum exhaust system so as to establish a substantially vacuum condition reaching a prescribed degree of vacuum within the chamber 11. After the chamber 11 is evacuated so as to establish the substantially vacuum condition, the mixed gas is supplied through the gas inlet portion 11a into the chamber 11 until the gaseous pressure within the chamber 11 is increased to reach 60 Pa. Further, the substrate 1 to be processed, which is housed in the chamber 11, is heated to 300° C. by the heating means arranged in, for example, the lower electrode 13. Then, the high frequency power source apparatus 14 is operated so as to supply a high frequency power of output voltage 500 W and frequency 40 MHz between the electrodes 12 and 13 through the matching device 15. As a result, a plasma is generated within the chamber 11. Since the free space within the chamber 11 is rich in the Xe gas as a rare gas, a high electron density is maintained within the chamber 11. It follows that a plasma is generated at a high density so as to permit the $O_2$ gas used as the oxidizing gas and the TEOS gas used as the silicon compound gas to be decomposed efficiently by the plasma. As a result, silicon oxide molecules ($SiO_2$) are deposited on one surface of the substrate 1 to be processed so as to form a silicon oxide film ($SiO_2$ film).

The characteristics of the $SiO_2$ film formed by the film-forming method according to the first embodiment of the present invention were evaluated as follows.

Specifically, prepared were a plurality of different kinds of mixed gases differing from each other in the percentage of the partial pressure of the Xe gas based on the total pressure of the mixed gas, followed by forming a $SiO_2$ film by the method described above in respect of each kind of the mixed gas. Then, an aluminum electrode was formed by means of a vapor deposition on the $SiO_2$ film thus formed so as to obtain a metal oxide semiconductor device (i.e., MOS device). The flat band voltage of each of the MOS devices was determined by measuring the capacitance-voltage characteristics of the $SiO_2$ film included in each of the MOS devices.

Figure 2:
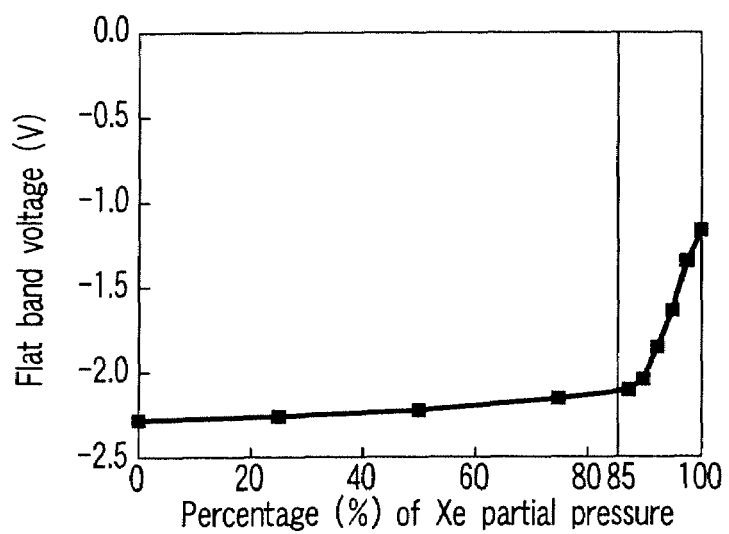
FIG. 2 is a graph showing the relationship between the percentage of the partial pressure of the Xe gas contained in a mixed gas and the flat band voltage of the MOS device.

FIG. 2 is a graph showing the relationship between the percentage of the partial pressure of the Xe gas (Pr) contained in the mixed gas and the flat band voltage of the MOS device. Incidentally, since a large number of stationary charges are contained in general in the $SiO_2$ film, the flat band voltage is shifted in the negative direction.

As shown in FIG. 2, the flat band voltage was held substantially constant at about −2.3V in the conventional MOS device in which the $SiO_2$ film was formed under the state that the percentage of the partial pressure of the Xe gas (Pr) contained in the mixed gas was set lower than 85%, i.e., 0%≦Pr<85%. On the other hand, the flat band voltage was found to fall within a range of between about −2.0V and about −1.0V in the MOS device according to the first embodiment of the present invention in which the $SiO_2$ film was formed under the state that the percentage of the partial pressure of the Xe gas (Pr) contained in the mixed gas was set at a level not smaller than 85%, i.e., 85%≦Pr<100%. In other words, the absolute value of the flat band voltage for the MOS device according to the first embodiment of the present invention was found to be smaller than that for the conventional MOS device.

It was necessary in the past for the stationary charge density of the $SiO_2$ film to be low. The small absolute value of the flat band voltage implies that the stationary charge density of the film is lowered. In other words, it has been found that it is possible to obtain a $SiO_2$ having a low stationary charges density by forming the $SiO_2$ under the state that the percentage of the partial pressure of the Xe gas (Pr) contained in the mixed gas is set at a level not smaller than 85%, i.e., 85%≦Pr<100%, as in the first embodiment of the present invention.

Figure 3:
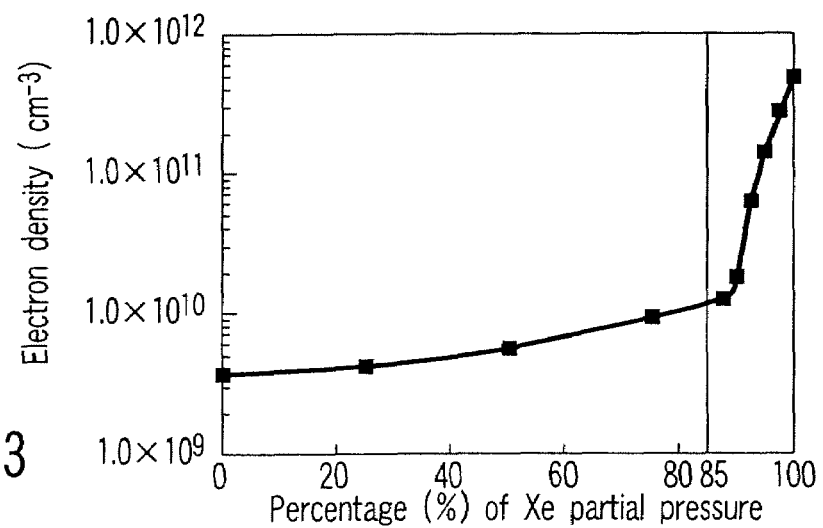
FIG. 3 is a graph showing the relationship between the percentage of the partial pressure of the Xe gas contained in a mixed gas and the electron density in the mixed gas.

FIG. 3 is a graph showing the relationship between the percentage of the partial pressure of the Xe gas (Pr) contained in the mixed gas and the electron density in the mixed gas.

As shown in FIG. 3, the electron density in the mixed gas is about $10^9$ cm$^{-3}$ under the state that the percentage of the partial pressure of the Xe gas (Pr) contained in the mixed gas is lower than 85%, i.e., 0%≦Pr<85%. However, the electron density in the mixed gas is increased to about $10^{10}$ to $10^{12}$ cm$^{-3}$, which is tens to hundreds of times as high as that in the case referred to above, if the percentage of the partial pressure of the Xe gas in the mixed gas (Pr) is set at a level not smaller than 85%, i.e., 85%≦Pr<100%, as defined in the present invention.

The experimental data support that the electron density in the plasma was rapidly increased in the film-forming method according to the first embodiment of the present invention. It is considered reasonable to understand that, since the Xe gas is formed of monatomic molecules, the electrons in the plasma are free from the energy loss in the film-forming method according to the first embodiment of the present invention, though the electrons in the plasma are caused to lose the energy by the dissociating reaction in the case of using polyatomic molecules. In other words, it is considered reasonable to understand that, if the electrons are not caused to lose the energy by the dissociating reaction, the electron density in the plasma is increased in the case where the supplied high frequency power is constant.

It follows that, according to the first embodiment of the present invention, it is possible to increase the electron density in the plasma so as to promote the decomposition of the TEOS gas and the $O_2$ gas achieved by the plasma. As a result, it is possible to form efficiently the Si atoms and the O atoms. It should also be noted that, if the O atoms are formed efficiently, it is possible to suppress the oxygen deficiency in the $SiO_2$ film, with the result that the current leakage through the $SiO_2$ film formed can be diminished.

Second Embodiment

In the first embodiment described above, the gaseous pressure within the chamber 11 is set at 60 Pa. As a result, the percentage of the partial pressure of the TEOS gas based on the total pressure of the mixed gas is decreased with increase in the percentage of the partial pressure of the rare gas (Xe gas) based on the total pressure of the mixed gas, i.e., with increase in the degree of dilution with the rare gas. It follows that it is possible for the film-forming rate to be lowered depending on the percentage of the partial pressure of the rare gas (Pr) based on the total pressure of the mixed gas. Since the manufacturing time is one of the factors determining the manufacturing cost of the product, it is desirable for the film-forming time to be short. Such being the situation, a second embodiment of the present invention is directed to a film-forming method that permits improving the film-forming rate.

In the first step, a mixed gas is formed of gases including a silicon compound gas consisting of compounds having silicon atoms, an oxidizing gas and a rare gas. In the second embodiment of the present invention, prepared are a TEOS gas acting both as a silicon compound gas and as an organometallic compound gas, an $O_2$ gas acting as an oxidizing gas, and a Xe gas used as a rare gas.

In the next step, the TEOS gas and the $O_2$ gas, which are mixed at a mixing ratio of 1:5, are supplied into the chamber 11 such that the sum of the partial pressures of these gases is 10 Pa, followed by supplying a Xe gas into the chamber 11 such that the percentage (diluting rate) of the partial pressure of the Xe gas (Pr) based on the total pressure within the chamber 11 is not smaller than 85%, i.e., 85%≦Pr<100%. As a result, a mixed gas is formed within the chamber 11. The other steps are equal to those for the first embodiment and, thus, the description of the overlapping portion is omitted.

Figure 4:
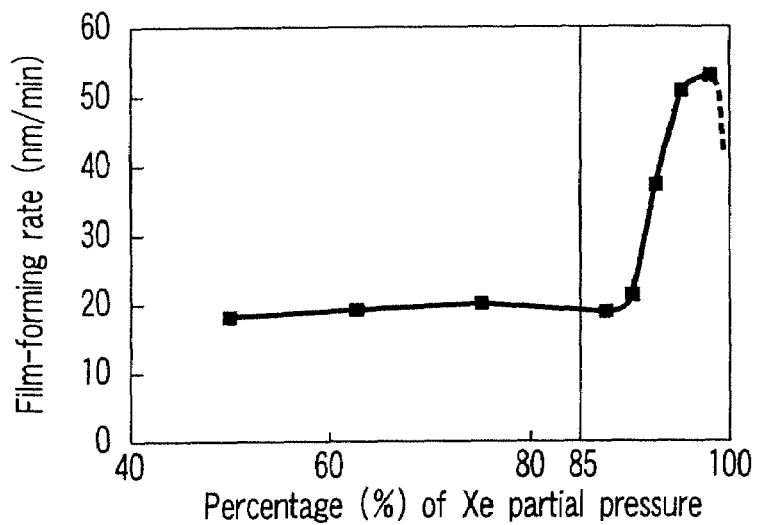
FIG. 4 is a graph showing the relationship between the percentage of the partial pressure of the Xe gas contained in a mixed gas and the forming rate the $SiO_2$ film.

FIG. 4 is a graph showing the relationship between the percentage of the partial pressure of the Xe gas (Pr) contained in the mixed gas and the forming rate of a $SiO_2$ film.

As shown in FIG. 4, the film-forming rate was maintained substantially constant at about 20 nm/min under the state that the percentage of the partial pressure of the Xe gas (Pr) contained in the mixed gas was lower than 90%, i.e., 0%≦Pr<90%. On the other hand, the film-forming rate was increased from about 20 nm/min to about 55 nm/min in the case where the percentage of the partial pressure of the Xe gas (Pr) contained in the mixed gas was set to fall within a range of between 90% and 98%, i.e., 90%≦Pr<98%.

A $SiO_2$ film was also formed under the conditions that the percentage of the partial pressure of the Xe gas (Pr) contained in the mixed gas was set at 95% and that the total pressure of the mixed gas was set at 200 Pa. Then, an aluminum electrode was formed by means of a vapor deposition on the $SiO_2$ film so as to obtain a MOS device. When the flat band voltage of the MOS device was measured, it was found that the absolute value of the flat band voltage was lowered, compared with the conventional MOS device. It follows that the film-forming rate is increased and the effect of improving the quality of the film can be obtained, if the $SiO_2$ film is formed under the conditions that the percentage of the partial pressure of the Xe gas (Pr) contained in the mixed gas is set at 95% and that the total pressure of the mixed gas is set at 200 Pa.

The density of the stationary charge is low as long as the TEOS gas and the $O_2$ gas are contained in the mixed gas even if the amounts of these gases are very small. In addition, it is possible to form a $SiO_2$ film that has a low current leakage. However, the film-forming rate is lowered, if the mixed gas is diluted by the Xe gas such that the percentage of the partial pressure of the Xe gas (Pr) based on the total pressure of the mixed gas is increased to exceed 98%. It follows that, in order to increase the film-forming rate and to obtain a satisfactory effect of improving the film quality, it is desirable for the percentage of the partial pressure of the Xe gas (Pr) based on the total pressure of the mixed gas to fall within a range of between 90% and 98%, i.e., $90\% \leq Pr < 98\%$.

As described above, the film-forming method according to the first and second embodiments of the present invention comprises the steps of supplying into a plasma processing chamber (chamber 11) at least three kinds of gases including a silicon compound gas formed of a compound having a silicon atom (i.e., a TEOS gas in each of the first and second embodiments, which is also an organometallic compound gas), an oxidizing gas, and a rare gas, the percentage of the partial pressure of the rare gas (Pr) based on the total pressure of all the gases being not smaller than 85%, i.e., $85\% \leq Pr < 100\%$; and generating a plasma within the plasma processing chamber so as to permit the silicon compound gas and the oxidizing gas to be decomposed by the plasma, thereby forming a film consisting of silicon oxide on a substrate to be processed. It follows that, in the film-forming method according to the first and second embodiments of the present invention, it is possible to form a $SiO_2$ film that is low in the oxygen deficiency easily at a low cost.

Also, in the film-forming method according to the first and second embodiments of the present invention, it is possible to obtain a $SiO_2$ film, which is low in the density of the stationary charge and in the current leakage. In other words, the characteristics of the $SiO_2$ film can be improved. In addition, it is possible to form the $SiO_2$ at about 300° C., which is lower than the temperature employed in the organometallic gaseous phase growth method.

Further, the film-forming rate can be rendered higher than that in the conventional method by allowing the percentage of the partial pressure of the rare gas (Pr) based on the total pressure to fall within a range of between 90% and 98%, i.e., $90\% \leq Pr < 98\%$.

Incidentally, in each of the first and second embodiments of the present invention described above, a Xe gas was used as the rare gas. However, it is also possible to use a krypton (Kr) gas, an argon (Ar) gas, a neon (Ne) gas or a helium (He) gas as the rare gas. It should be noted, however, that the silicon compound gas (organometallic compound gas) and the oxidizing gas can be decomposed efficiently by the plasma, if the electron density is high. It follows that it is desirable for the rare gas to exhibit a high electron density. Under the circumstances, the order of preference of the rare gas to be used is Xe gas>Kr gas>Ar gas>Ne gas>He gas in order to increase the electron density within the plasma processing chamber (chamber 11).

Third Embodiment

In the first step, prepared is the substrate 1 to be processed. It is possible to use, for example, a silicon substrate for forming a semiconductor device, a glass substrate for forming the display circuit for a liquid crystal display device or a plastic substrate as the substrate 1 to be processed as in the first embodiment described previously. A silicon substrate is used in the third embodiment described in the following.

In the next step, prepared is a mixed gas consisting of at least three kinds of gases including a silicon compound gas, an oxidizing gas and a hydrogen gas ($H_2$ gas). It is also possible to mix the silicon compound gas, the oxidizing gas and the hydrogen gas when these gases are introduced into the chamber 11 so as to form a desired mixed gas.

In the third embodiment of the present invention, the mixed gas is prepared by mixing a TEOS gas, which is used as a silicon compound gas and as an organometallic compound gas, an $O_2$ gas used as an oxidizing gas, and a $H_2$ gas. The mixing ratio of the TEOS gas to the $O_2$ gas in the mixed gas is 1:15. Also, the percentage of the partial pressure of the $H_2$ gas (Ph) based on the total pressure of the mixed gas, which is 100%, is set at a level not larger than 3%, i.e., $0\% < Ph \leq 3\%$.

In the third embodiment of the present invention, prepared were two kinds of the mixed gases consisting of a mixed gas in which the mixing ratio of the TEOS gas to the $O_2$ gas was set at 1:15 and the percentage of the partial pressure of the $H_2$ gas (Ph) contained in the mixed gas was set at 0.5%, and another mixed gas in which the mixing ratio of the TEOS gas to the $O_2$ gas was set at 1:15 and the percentage of the partial pressure of the $H_2$ gas (Ph) contained in the mixed gas was set at 3%.

In the next step, the substrate 1 to be processed was housed in the chamber 11 of the plasma CVD apparatus 10 shown in FIG. 1. The plasma CVD apparatus used was equal to that used in the first embodiment described previously and, thus, the overlapping description is omitted.

Then, the vacuum exhaust system was operated so as to set up a substantially vacuum condition substantially reaching a desired degree of vacuum within the chamber 11. After the chamber 11 was evacuated so as to set up a vacuum condition, the mixed gas was supplied into the chamber 11 until the gaseous pressure within the chamber 11 was increased to reach 80 Pa. Then, the substrate 1 to be processed was heated to, for example, 300° C. by the heating means arranged within the lower electrode 13. Further, the high frequency power source apparatus 14 was operated so as to supply a high frequency power between the electrodes 12 and 13 through the matching device 15, thereby generating a plasma within the chamber 11. The TEOS gas is decomposed within the plasma so as to form Si atoms. Also, a reaction is carried out between the $H_2$ gas and the $O_2$ gas so as to form O atoms efficiently. As a result, $SiO_2$ molecules are deposited on the substrate 1 to be processed so as to form a $SiO_2$ film.

The characteristics of the $SiO_2$ film formed by the film-forming method according to the third embodiment of the present invention were evaluated as follows.

In the first step, mixing gas conditions 1) to 3) given below were prepared:

1) The mixing gas condition under which the TEOS gas was mixed with the $O_2$ gas at a mixing ratio of 1:15 as in the conventional method.

2) The mixing gas condition under which the TEOS gas was mixed with the $O_2$ gas at a mixing ratio of 1:15, and the percentage of the partial pressure of the $H_2$ gas (Ph) contained in the mixed gas was set at 0.5%, as in the third embodiment of the present invention.

3) The mixing gas condition under which the TEOS gas was mixed with the $O_2$ gas at a mixing ratio of 1:15, and the percentage of the partial pressure of the $H_2$ gas (Ph) contained in the mixed gas was set at 3%, as in the third embodiment of the present invention.

A $SiO_2$ film was formed as described above under each of conditions 1) to 3) given above, followed by forming by means of a vapor deposition an aluminum electrode on the $SiO_2$ film thus formed so as to obtain a MOS device. Then, the flat band voltage of each of the MOS devices was determined by measuring the capacitance-voltage characteristics of the $SiO_2$ film included in each of the MOS devices.

Figure 5:
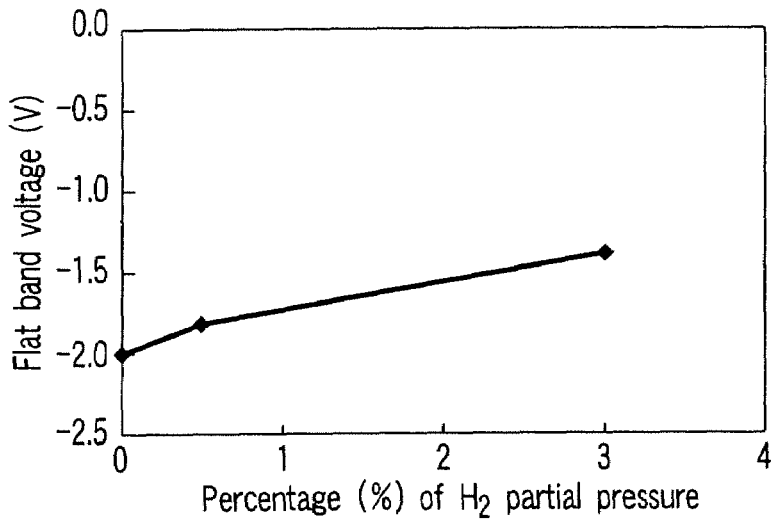
FIG. 5 is a graph showing the relationship between the percentage of the partial pressure of the $H_2$ gas contained in a mixed gas and the flat band voltage of the MOS device.

FIG. 5 is a graph showing the relationship between the percentage of the partial pressure of the $H_2$ gas (Ph) contained in the mixed gas and the flat band voltage of the MOS device.

As shown in FIG. 5, the flat band voltage was about −2.0V in the conventional MOS device in which the $SiO_2$ film was formed under the mixing gas condition 1) given above. On the other hand, the flat band voltage was found to be about −1.8V in the MOS device in which the $SiO_2$ film was formed under the mixing gas condition 2) given above. Further, the flat band voltage was found to be about −1.4V in the MOS device in which the $SiO_2$ film was formed under the mixing gas condition 3) given above. In other words, the absolute value of the flat band voltage was found to be smaller in the MOS device according to the third embodiment of the present invention than that in the conventional MOS device. In other words, it has been found that a $SiO_2$ film having a low stationary charge density can be formed by adding $H_2$ gas to the mixed gas.

It is considered reasonable to understand that, since the $H_2$ gas is capable of reacting with the $O_2$ gas, the oxygen atoms can be formed efficiently so as to form a $SiO_2$ film having a low stationary charge density. What should be noted is that, in the film-forming method according to the third embodiment of the present invention, the oxygen atoms can be formed efficiently so as to suppress the oxygen deficiency in the $SiO_2$ film, with the result that it is possible to suppress the current leakage through the $SiO_2$ film.

Incidentally, the $O_2$ gas and the $H_2$ gas are present together in the mixed gas. Therefore, if the percentage of the partial pressure of the $H_2$ gas (Ph) contained in the mixed gas is increased to reach 4% or more, it is possible for the $H_2$ gas to react with the $O_2$ gas explosively. It follows that, if the percentage of the partial pressure of the $H_2$ gas (Ph) is set at 4% or more, careful attention is required in the film-forming process and in the film-forming apparatus. Naturally, it is not desirable to set the percentage of the partial pressure of the $H_2$ gas (Ph) at 4% or more. The effect described above can be obtained if the $H_2$ gas is contained in the mixed gas. It follows that, in view of the safety and the manufacturing cost, it is desirable to set the percentage (diluting rate) of the partial pressure of the $H_2$ gas (Ph) contained in the mixed gas at a level smaller than 3%, i.e., $0\% \leq Ph < 3\%$.

As described above, the film-forming method according to the third embodiment of the present invention comprises the steps of supplying into a plasma processing chamber (chamber 11) at least three kinds of gases including a silicon compound gas formed of a compound having silicon atoms (i.e., a TEOS gas, which also constitutes an organometallic compound gas, being used in the third embodiment), an oxidizing gas, and a hydrogen gas; and generating a plasma within the plasma processing chamber so as to permit the silicon compound gas, the oxidizing gas and the $H_2$ gas to be decomposed by the plasma, thereby forming a $SiO_2$ film on a substrate to be processed. It follows that the film-forming method according to the third embodiment of the present invention makes it possible to form a $SiO_2$ film, which is small in the oxygen deficiency, easily, and at a low cost.

Also, in the film-forming method according to each of the first and second embodiments of the present invention, it is possible to obtain a $SiO_2$ film, which is low in the stationary charge density and small in the current leakage. In other words, it is possible to improve the characteristics of the $SiO_2$ film. In addition, the $SiO_2$ film can be formed at about 300° C., which is lower than that in the organometallic gaseous phase growth method.

Incidentally, a TEOS gas, which is also an organometallic compound gas, is used as a gas of a silicon compound having a Si atom. However, it is also possible to use as the silicon compound gas a gas of any of tetramethyl cyclo-tetrasiloxane, di-acetoxy di-tertiary butoxy silane, and hexamethyl disiloxane. It is also possible to use as the silicon compound gas any of a $SiH_4$ gas, a $Si_2H_6$ gas, a $SiF_4$ gas, a $SiCl_4$ gas, a $SiH_2Cl_2$ gas, and a mixed gas containing gases of at least two of these Si-containing compounds.

Also, in each of the first to third embodiments of the present invention described above, an $O_2$ gas was used as an oxidizing gas. However, it is also possible to use as the oxidizing gas at least one of an $O_3$ (ozone) gas, $N_2O$ (dinitrogen oxide) gas, a NO (nitrogen monoxide) gas, a CO (carbon monoxide) gas, and a $CO_2$ (carbon dioxide) gas. Among these oxidizing gases, it is desirable to use an $O_3$ gas because the $O_3$ gas can be decomposed easily and has a high reactivity, compared with the other oxidizing gas. The silicon compound gas is preferably $SiH_4$ gas, and the oxidizing gas is preferably at least one of $O_3$ gas and $O_2$ gas.

It should be noted that, if a gas of a compound having a nitrogen (N) atom such as a $N_2O$ gas or a NO gas is used as the oxidizing gas, the nitrogen atoms are localized at the interface. Therefore, the interface state density is increased in the case of depositing $SiO_2$ molecules, which is not desirable for the semiconductor device. The particular tendency is rendered prominent with increase in the electron density in the plasma. In other words, the particular tendency is rendered prominent in the film-forming method described in conjunction with the first to third embodiments of the present invention.

On the other hand, it is desirable to use as the oxidizing gas a gas of the compound having a carbon atom such as a CO gas or a $CO_2$ gas. It is considered reasonable to understand that, since the TEOS gas itself has carbon atoms, the impurity of the $SiO_2$ film formed is not affected even if a gas having carbon atoms such as a CO gas or a $CO_2$ gas is used as the oxidizing gas.

Also, in the case of using a TEOS gas as a gas of a compound having a Si atom, it is possible to form a $SiO_2$ film that is satisfactory in its coverage properties. Therefore, it is desirable to use the TEOS gas in the case where it is necessary to form a $SiO_2$ film in a selected region having an irregularity on the surface like the thin film transistor (TFT) included in a liquid crystal display device 20 shown in FIG. 10. In other words, a TFT including a gate insulating film satisfactory in its insulating properties can be obtained by forming a gate insulating film of a $SiO_2$ film by using a TEOS gas as a silicon compound gas of a compound having a Si atom.

Such being the situation, it is desirable to use a TEOS gas as a silicon compound gas in order to form a $SiO_2$ that is satisfactory in its coverage properties. Also, in the case where a TEOS gas is used as a silicon compound gas, it is desirable to use at least one kind of gas selected from the group consisting of an $O_2$ gas, an $O_3$ gas, a CO gas, and a $CO_2$ gas as an oxidizing gas.

On the other hand, in the case where a gas of an inorganic compound such as a $SiH_4$ gas or a $Si_2H_6$ gas is used as the silicon compound gas, it is possible for the carbon atoms contained in the CO gas or the $CO_2$ gas used as an oxidizing gas to constitute impurities in the process of forming a $SiO_2$ film. Therefore, in the case of using a silane gas as a silicon compound gas, it is desirable to use as the oxidizing gas at least one kind of the gas selected from the group consisting of the $O_2$ gas and the $O_3$ gas. In this case, it is possible to form a $SiO_2$ film having a high purity.

It should be noted that the effect produced by the first to third embodiments of the present invention is not affected by the exciting frequency of the plasma and by the plasma source.

In order to obtain a plasma having a higher density, it is desirable to use a microwave having a high exciting frequency, e.g., a frequency of 2.45 GHz or higher. It is advisable to use, for example, a surface wave plasma, which is one of microwave plasma sources free from a magnetic field, as the plasma source using a microwave.

Fourth Embodiment

Figure 6:
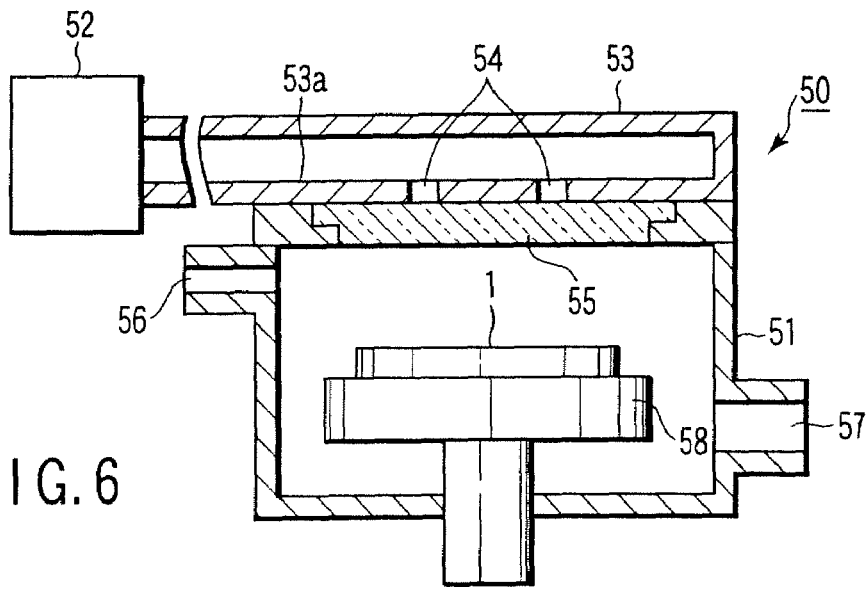
FIG. 6 schematically shows the construction of a microwave plasma CVD apparatus free from a magnetic field, which is used in the film-forming method according to any of fourth to seventh embodiments of the present invention.

A microwave plasma CVD apparatus 50 free from a magnetic field, which is used in a fourth embodiment of the present invention, will now be described with reference to FIG. 6.

The microwave plasma CVD apparatus 50 free from a magnetic field comprises a vacuum chamber 51 acting as a plasma processing vessel, a microwave source 52, a waveguide 53, a plurality of slots 54, a dielectric member 55, a gas inlet port 56, a gas evacuation port 57 and a substrate table 58.

The substrate table 58 is arranged within the vacuum chamber 51. A gate (not shown) is arranged in the vacuum chamber 51. The gate performs the function of transferring the substrate 1 to be processed, e.g., a glass substrate on which is formed a display circuit of a liquid crystal display device such as a transistor, into and out of the vacuum chamber 51. The vacuum chamber 51 has an effective processing area of, for example, 70 cm×60 cm. The microwave source 52 generates a microwave having a frequency of, for example, 2.45 GHz. The waveguide 53, which is formed of, for example, a rectangular waveguide, has a width of, for example, 9 cm and a height of, for example, 3 cm.

A plurality of slots 54 are formed in a side wall 53a of the waveguide 53, the side wall being positioned to face the upper wall of the vacuum chamber 51. The dielectric member 55 provides a window having a thickness large enough to withstand the vacuum condition formed within the vacuum chamber 51 and formed of a material that permits transmitting the microwave. For example, the dielectric member 55 is formed of quartz, glass or a ceramic material. The gas inlet 56 is connected to a vessel housing a raw material gas by a pipe such that the raw material gas is supplied into the vacuum chamber 51 at a prescribed flow rate and a prescribed flowing speed. Further, the gas evacuation port 57 is formed of a pipe for releasing the gas after the processing from within the vacuum chamber 51 to the outside.

The vacuum chamber 51 is evacuated first to a prescribed degree of vacuum. Then, a mixed gas containing the raw material gas is supplied through the gas inlet 56 into the vacuum chamber 51 at a prescribed flow rate and a prescribed flowing speed. The microwave oscillated from the oscillator included in the microwave source 52 is propagated through the waveguide 53 so as to be radiated into the vacuum chamber 51 through the slots 54 forming a waveguide antenna and the dielectric body member 55. In the apparatus 50 shown in FIG. 6, a plasma is generated by the microwave radiated from the slots 54 into the vacuum chamber 51 so as to carry out the film-forming operation.

The film-forming method according to a fourth embodiment of the present invention will now be described with reference to the plasma CVD apparatus 50 shown in FIG. 6.

In the first step, the substrate 1 to be processed is prepared. It is possible to use as the substrate 1 to be processed any of a silicon substrate for forming a semiconductor device such as a transistor, a glass substrate for forming a display circuit of a liquid crystal display device, and a plastic substrate. In the fourth embodiment of the present invention, a silicon substrate is used as the substrate 1 to be processed.

In the next step, a mixed gas including an organometallic compound gas, an oxidizing gas and a rare gas is prepared. Incidentally, it is also possible to mix the organometallic compound gas, the oxidizing gas and the rare gas in the process of introducing these gases into the vacuum chamber 51 so as to prepare a desired mixed gas.

In the fourth embodiment of the present invention, a tripropoxy hafnium ($Hf(OC_3H_7)_3$) gas used as an organometallic compound gas, an $O_2$ gas used as an oxidizing gas, and an Ar gas used as a rare gas are mixed so as to prepare the mixed gas. The percentage (diluting rate) of the partial pressure of the Ar gas (Pr) contained in the mixed gas is not smaller than 85%, i.e., 85%≦Pr<100%. For example, the percentage Pr noted above is set at 90%. To be more specific, the mixing ratio of the tripropoxy hafnium gas: the $O_2$ gas: the Ar gas is set at 2%:8%:90% in the fourth embodiment of the present invention.

In the next step, the substrate 1 to be processed is housed in the vacuum chamber 51 of the plasma CVD apparatus 50, followed by operating the vacuum exhaust system so as to evacuate the vacuum chamber 51 in a manner to set up a condition substantially equal to the vacuum condition within the vacuum chamber 51. Further, after the vacuum exhaust treatment is applied to the vacuum chamber 51, the mixed gas is supplied into the vacuum chamber 51 until the gaseous pressure within the vacuum chamber 51 is increased to reach 80 Pa. Then, a high frequency power source apparatus (not shown) is operated so as to generate a surface wave plasma, which is one of the microwave plasma sources free from a magnetic field, within the vacuum chamber 51 by use of a microwave having an output voltage of 1000 W and a frequency of 2.45 G. Since the free space within the vacuum chamber 51 is rich in the Ar gas, a high electron density is maintained within the vacuum chamber 51, with the result that a surface wave plasma is generated at a high density. It follows that the $O_2$ gas and the tripropoxy hafnium gas can be decomposed efficiently by the plasma. As a result, the hafnium oxide ($HfO_2$) molecules are deposited on one surface of the substrate 1 to be processed so as to form a hafnium oxide film ($HfO_2$ film) having a high dielectric constant.

FIG. 7 is a graph showing the relationship between the percentage of the partial pressure of the Ar gas (Pr) contained in the mixed gas and the electron density.

As shown in FIG. 7, the electron density within the mixed gas is about $10^9$ cm$^{-3}$ in the case where the percentage of the partial pressure of the Ar gas (Pr) contained in the mixed gas is smaller than 85%, i.e., 0%≦Pr<85%. On the other hand, where the percentage of the partial pressure of the Ar gas (Pr) contained in the mixed gas is not smaller than 85%, i.e., 85%≦Pr<100%, the electron density within the mixed gas is about $10^{10}$ to $10^{12}$ cm$^{-3}$, which is tens to hundreds of times as high as that in the case where the percentage Pr noted above is smaller than 85%.

The experimental data given above support that it is possible to increase rapidly the electron density within the plasma in the film-forming method according to the fourth embodiment of the present invention. It is considered reasonable to understand that, since the Ar gas is formed of monatomic molecules like the Xe gas, the electrons in the plasma are free from the energy loss in the film-forming method according to the fourth embodiment of the present invention, though the electrons in the plasma are caused to lose their energy by the dissociating reaction in the case of using polyatomic molecules. In other words, it is considered reasonable to understand that, if the electrons are not caused to lose their energy by the dissociating reaction, the electron density in the plasma is increased in the case where the supplied high frequency power is constant.

Fifth Embodiment

The CVD apparatus shown in FIG. 1 is used in a fifth embodiment of the present invention. In the first step, the substrate 1 to be processed is prepared. It is possible to use, for example, a silicon substrate, a glass substrate or a plastic substrate as the substrate 1 to be processed. In the fifth embodiment, the substrate 1 to be processed is formed of, for example, silicon.

In the next step, a mixed gas including an organometallic compound gas, an oxidizing gas and a $H_2$ gas is prepared. In the fifth embodiment of the present invention, the mixed gas is prepared by mixing a tripropoxy hafnium gas used as an organometallic compound gas, an $O_2$ gas used as an oxidizing gas, and a $H_2$ gas. It is desirable for the percentage (diluting rate) of the partial pressure of the $H_2$ gas (Ph) contained in the mixed gas to be set at a level smaller than 3%, i.e., $0\% \leq Ph < 3\%$. If the percentage of the partial pressure of the $H_2$ gas (Ph) contained in the mixed gas is increased to reach 4% or more, it is possible for the $H_2$ gas to react with the $O_2$ gas explosively, as already described in conjunction with the third embodiment of the present invention. To be more specific, the mixing ratio of the tripropoxy hafnium gas: the $O_2$ gas: $H_2$ gas is set at 20%:78%:2% in the fifth embodiment of the present invention.

In the next step, the substrate 1 to be processed is housed in the vacuum chamber 11 included in the plasma CVD apparatus 10, followed by operating the vacuum exhaust system so as to establish a condition substantially equal to the vacuum condition within the vacuum chamber 11. Further, after the vacuum chamber 11 is evacuated so as to set up a vacuum condition, the mixed gas is supplied into the vacuum chamber 11 until the gaseous pressure within the vacuum chamber 11 is increased to reach 80 Pa. Then, the high frequency power source apparatus 14 is operated so as to generate a surface wave plasma, which is one of microwave plasma sources free from a magnetic field, within the vacuum chamber 11 by using a microwave of 1,000 W and 2.45 G. Within the surface wave plasma, the tripropoxy hafnium gas is decomposed so as to generate Hf atoms. Also, the reaction is carried out between the $H_2$ gas and the $O_2$ gas within the surface wave plasma so as to form O atoms efficiently. As a result, $HfO_2$ molecules are deposited on the substrate 1 to be processed so as to form a $HfO_2$ film having a high dielectric constant.

The characteristics of the $HfO_2$ film formed by the film-forming method according to each of the fourth and fifth embodiments of the present invention were evaluated as follows.

Specifically, a $HfO_2$ film was formed on a silicon substrate by each of the conventional film-forming method, in which was used a mixed gas prepared by mixing a tripropoxy hafnium gas and an $O_2$ gas at a mixing ratio of 20%:80%, the film-forming method according to the fourth embodiment of the present invention and the film-forming method according to the fifth embodiment of the present invention. Then, the current-voltage characteristics were measured for each of these $HfO_2$ films.

FIG. 8 is a graph showing the current leakage at the time when an electric field of 2MV/cm was applied to each of the $HfO_2$ film formed by the conventional film-forming method, the $HfO_2$ film formed by the film-forming method according to the fourth embodiment of the present invention, and the $HfO_2$ film formed by the film-forming method according to the fifth embodiment of the present invention.

As shown in FIG. 8, the current leakage was about $10^{-11}$ (A) in the case of the $HfO_2$ film formed by the conventional film-forming method. On the other hand, the current leakage was about $10^{-12}$ (A) in the case of the $HfO_2$ film formed by the film-forming method according to the fourth and fifth embodiments of the present invention. It follows that the film-forming method according to the fourth and fifth embodiments of the present invention permits lowering the current leakage through the metal oxide film, compared with the conventional film-forming method.

It is considered reasonable to understand that the particular effect of the present invention is produced as follows. Specifically, in the film-forming method according to the fourth embodiment of the present invention, the plasma density is increased so as to permit the tripropoxy hafnium gas and the $O_2$ gas to be decomposed efficiently by the plasma. As a result, the $HfO_2$ film formed is densified so as to decrease the amount of the oxygen deficiency.

Also, in the film-forming method according to the fifth embodiment of the present invention, the reaction is carried out between the $O_2$ gas and the $H_2$ gas within the plasma so as to generate O atoms and H atoms. As a result, the amount of the oxygen deficiency in the resultant $HfO_2$ film is considered to be decreased so as to cause the oxygen defect to be terminated with hydrogen.

Also, in the film-forming method according to the fourth embodiment of the present invention, the mixed gas used is prepared by mixing an organometallic compound gas, an oxidizing gas and a rare gas such that the percentage of the partial pressure of the rare gas (Pr) based on the total pressure of the mixed gas is set at a level not smaller than 85%, i.e., $85\% \leq Pr < 100\%$. As a result, the carbon atom concentration in the film can be suppressed in the fourth embodiment as in a sixth embodiment of the present invention that is to be described herein later.

Further, in the film-forming method according to the fifth embodiment of the present invention, a film is formed by using a mixed gas prepared by mixing an organometallic compound gas, an oxidizing gas and a hydrogen gas. As a result, the carbon atom concentration in the film can be suppressed in the fifth embodiment as in a seventh embodiment of the present invention that is to be described herein later.

According to each of the fourth and fifth embodiments of the present invention, it is possible to form a metal oxide film, which is small in oxygen deficiency, easily, and at a low cost. It is also possible to decrease the current leakage through the metal oxide film and to suppress the carbon atom concentration in the film so as to improve the characteristics of the film.

Sixth Embodiment

In a sixth embodiment of the present invention, a mixed gas is prepared by mixing a trimethyl aluminum gas (TMA gas) used as an organometallic compound gas, an $O_2$ gas used as an oxidizing gas and a Kr gas used as a rare gas. Also, the percentage (diluting rate) of the partial pressure of the Kr gas (Pr) contained in the mixed gas is set at a level not smaller than 85%, i.e., $85\% \leq Pr < 100\%$. For example, the percentage Pr noted above is set at 98%. To be more specific, the mixing ratio of the TMA gas, the $O_2$ gas and the Kr gas is set at 0.5%:1.5%:98%. Incidentally, the sixth embodiment is equal to the fourth embodiment in the other steps and, thus, the overlapping description is omitted. In this fashion, an $Al_2O_3$ film is formed in the sixth embodiment of the present invention.

Seventh Embodiment

In a seventh embodiment of the present invention, a mixed gas is prepared by mixing a TMA gas used as an organometallic compound gas, an $O_2$ gas used as an oxidizing gas and a $H_2$ gas. To be more specific, the mixing ratio of the TMA gas, the $O_2$ gas and the $H_2$ gas is set at 10%:89%:1%. Incidentally, the seventh embodiment is equal to the fifth embodiment in the other steps and, thus, the overlapping description is omitted. In this fashion, an $Al_2O_3$ film is formed in the seventh embodiment of the present invention.

The characteristics of the $Al_2O_3$ film formed by the film-forming method according to each of the sixth and seventh embodiments of the present invention were evaluated as follows.

Specifically, an $Al_2O_3$ film was formed in a thickness of 200 nm on a silicon substrate by each of the conventional film-forming method, in which was used a mixed gas prepared by mixing a TMA gas and an $O_2$ gas at a mixing ratio of 10%:90%, the film-forming method according to the sixth embodiment of the present invention and the film-forming method according to the seventh embodiment of the present invention. Then, the carbon concentration in the $Al_2O_3$ film was measured by SIMS (secondary ion mass spectrometry) for each of the $Al_2O_3$ films. Incidentally, the pressure of the plasma was 80 Pa and the power was 1,000 W.

FIG. 9 is a graph showing the carbon atom concentration in each of the $Al_2O_3$ film formed by the conventional film-forming method, the $Al_2O_3$ film formed by the film-forming method according to the sixth embodiment of the present invention, and the $Al_2O_3$ film formed by the film-forming method according to the seventh embodiment of the present invention.

As shown in FIG. 9, the carbon atom concentration was about $10^{21}$ atoms/$cm^3$ in the $Al_2O_3$ film formed by the conventional film-forming method. On the other hand, the carbon atom concentration was about $10^{19}$ atoms/$cm^3$ in the $Al_2O_3$ film formed by the film-forming method according to the sixth or seventh embodiment of the present invention. It follows that the film-forming method according to the sixth embodiment and the seventh embodiment of the present invention makes it possible to lower the carbon atom concentration, compared with the conventional film-forming method.

The low carbon atom concentration achieved by the film-forming method according to the sixth embodiment of the present invention is derived from the situation that the plasma density is increased by the rare gas (Kr gas) so as to improve the efficiency of forming the oxygen atoms. In other words, if the number of oxygen atoms is increased, the amounts of CO and $CO_2$ formed by the combustion reaction with carbon are increased. It is considered reasonable to understand that, since CO and $CO_2$, which are high in volatility, tend to be discharged without being taken in the film, the carbon atom concentration in the film is lowered.

Also, in the film-forming method according to the seventh embodiment of the present invention, it is considered reasonable to understand that a large number of oxygen atoms are generated by the reaction between $O_2$ and $H_2$ that is carried out within the plasma so as to lower the carbon atom concentration in the film. If a large number of oxygen atoms are generated, the amounts of CO and $CO_2$ formed by the combustion reaction with carbon are increased as in the sixth embodiment described above. It is considered reasonable to understand that, since CO and $CO_2$, which are high in volatility, tend to be discharged without being taken in the film, the carbon atom concentration in the film is lowered.

Also, in the film-forming method according to the sixth embodiment of the present invention, a mixed gas is prepared by mixing an organometallic compound gas, an oxidizing gas and a rare gas such that the percentage of the partial pressure of the rare gas (Pr) is set at a level not smaller than 85%, i.e., 85%≦Pr<100%. It follows that, according to the film-forming method according to the sixth embodiment of the present invention, it is possible to decrease the current leakage through the metal oxide film as in the fourth embodiment of the present invention.

Further, in the film-forming method according to the seventh embodiment of the present invention, a mixed gas is prepared by mixing an organometallic compound gas, an oxidizing gas and a hydrogen gas. It follows that, in the film-forming method according to the seventh embodiment of the present invention, it is possible to decrease the current leakage through the metal oxide film as in the fifth embodiment of the present invention.

According to each of the sixth and seventh embodiments of the present invention, it is possible to form a metal oxide film, which is small in oxygen deficiency, easily, and at a low cost. Also, according to each of the sixth and seventh embodiments of the present invention, it is possible to decrease the current leakage through the metal oxide film and to suppress the carbon atom concentration in the film so as to improve the characteristics of the film.

As described above, the film-forming method according to each of the fourth and sixth embodiments of the present invention comprises the steps of supplying into a plasma processing chamber (chamber 11) at least three kinds of gases including an organometallic compound gas, an oxidizing gas and a rare gas such that the percentage of the partial pressure of the rare gas (Pr) based on the total pressure is set at a level not smaller than 85%, i.e., 85%≦Pr<100%; and generating a plasma within the plasma processing chamber so as to permit the organometallic compound gas and the oxidizing gas to be decomposed by the plasma, thereby forming a metal oxide film on the substrate 1 to be processed. It follows that, in the film-forming method according to each of the fourth and sixth embodiments of the present invention, it is possible to form a metal oxide film, which has a high dielectric constant and is low in oxygen deficiency, easily, and at a low cost.

Also, in the film-forming method according to each of the fourth and sixth embodiments of the present invention, it is possible to decrease the current leakage through the metal oxide film and to suppress the carbon atom concentration in the film so as to improve the characteristics of the metal oxide film. In addition, it is possible to form the metal oxide film at a temperature lower than that employed in the organometallic gaseous phase growth method.

The film-forming method according to each of the fifth and seventh embodiments of the present invention comprises the step of supplying into a plasma processing chamber (chamber 11) at least three kinds of gases including an organometallic compound gas, an oxidizing gas and a hydrogen gas, and the step of generating a plasma within the plasma processing chamber so as to permit the organometallic compound gas, the oxidizing gas, and the hydrogen gas to be decomposed by the plasma, thereby forming a metal oxide film on the substrate 1 to be processed. It follows that, in the film-forming method according to each of the fifth and seventh embodiments of the present invention, it is possible to form a metal oxide film, which has a high dielectric constant and is low in oxygen deficiency, easily, and at a low cost.

Also, in the film-forming method according to each of the fifth and seventh embodiments of the present invention, it is possible to decrease the current leakage through the metal oxide film and to suppress the carbon atom concentration in the film so as to improve the characteristics of the metal oxide film. In addition, it is possible to form the metal oxide film at a temperature lower than that employed in the organometallic gaseous phase growth method.

Incidentally, in the film-forming method according to each of the fourth and fifth embodiments of the present invention, a tripropoxy hafnium gas is used as the organometallic compound gas. Also, in the film-forming method according to each of the sixth and seventh embodiments of the present invention, a TMA ($Al(CH_3)_3$) gas is used as the organometallic compound gas. However, the organometallic compound used in the present invention is not limited to the gases exemplified above. An organometallic compound gas such as triethyl aluminum($Al(C_2H_5)_3$) gas, tripropoxy zirconium($Zr(OC_3H_7)_3$) gas, pentaethoxy tantalum($Ta(OC_2H5)_5$) gas or the like can be used. It suffices to select an organometallic compound gas containing the metal providing the raw material of the metal oxide film that is to be formed. To be more specific, it is possible to form a $HfO_2$ film in the case of using a tripropoxy hafnium gas as the organometallic compound gas. Also, it is possible to form an aluminum oxide ($Al_2O_3$) film in the case of using a trimethyl aluminum gas or a trimethyl aluminum gas as the organometallic compound gas. Further, it is possible to form a zirconium oxide ($ZrO_2$) film in the case of using a tripropoxy zirconium gas as the organometallic compound gas. Still further, it is possible to form a tantalum oxide ($Ta_2O_5$) film in the case of using a pentaethoxy tantalum gas as the organometallic compound gas.

Further, in each of the fourth to seventh embodiments of the present invention, a surface wave plasma is generated within the plasma processing chamber (chamber 11), with the result that the organometallic compound gas, etc. are decomposed by the plasma within the plasma of a high density, which is unlikely to do damage to the resultant metal oxide film.

Incidentally, in each of the first to seventh embodiments described above, a silicon substrate is used as the substrate 1 to be processed. However, it is also possible to use as the substrate 1 to be processed any of a silicon substrate, a glass substrate and a plastic substrate having any of an insulating film, a metal film and a semiconductor film formed thereon or a substrate having a laminate structure including an insulating film, a metal film or a semiconductor film formed thereon.

Figure 10:
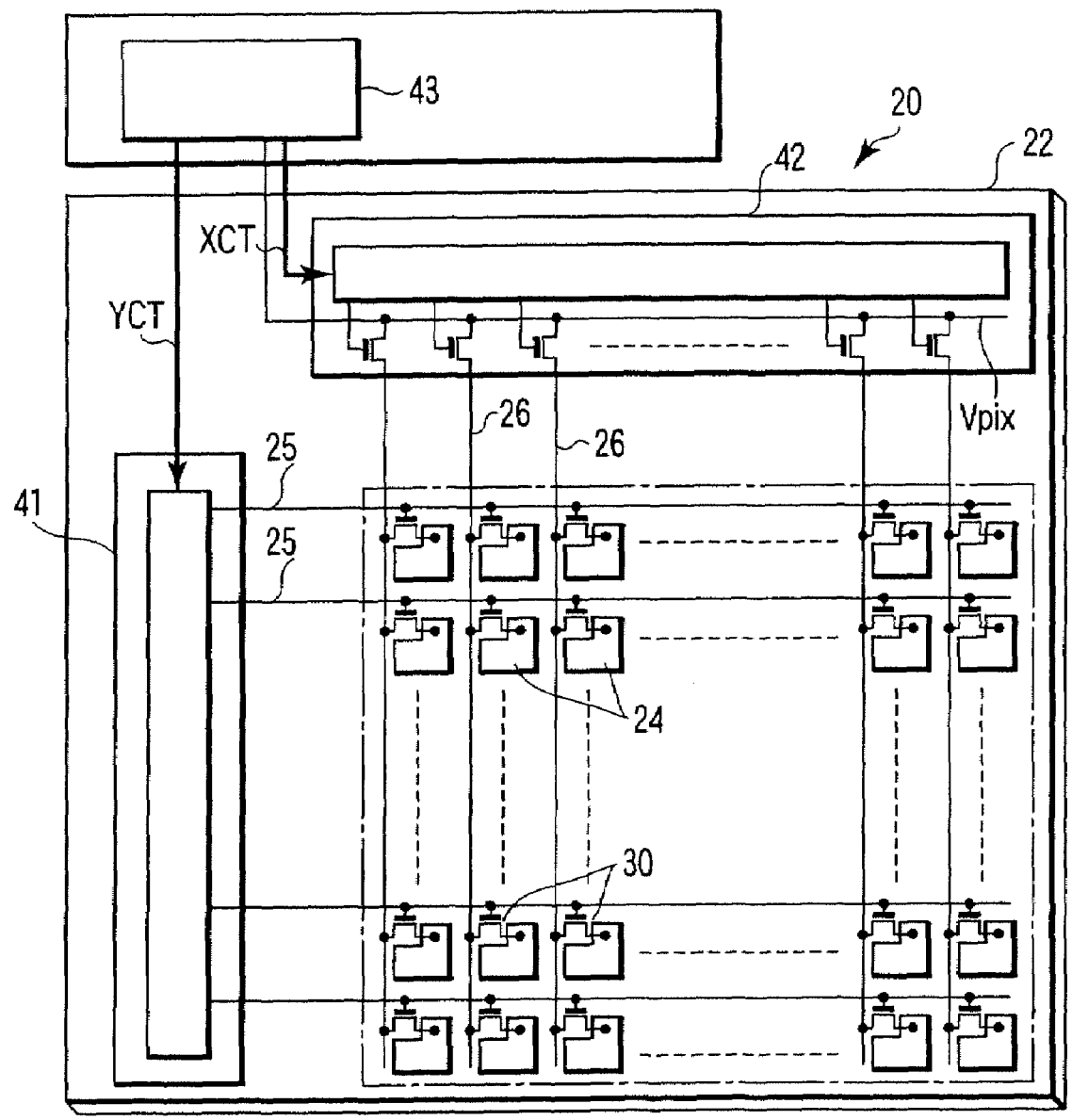
FIG. 10 is a plan view showing the construction of a liquid crystal display device comprising TFTs.
Figure 11:
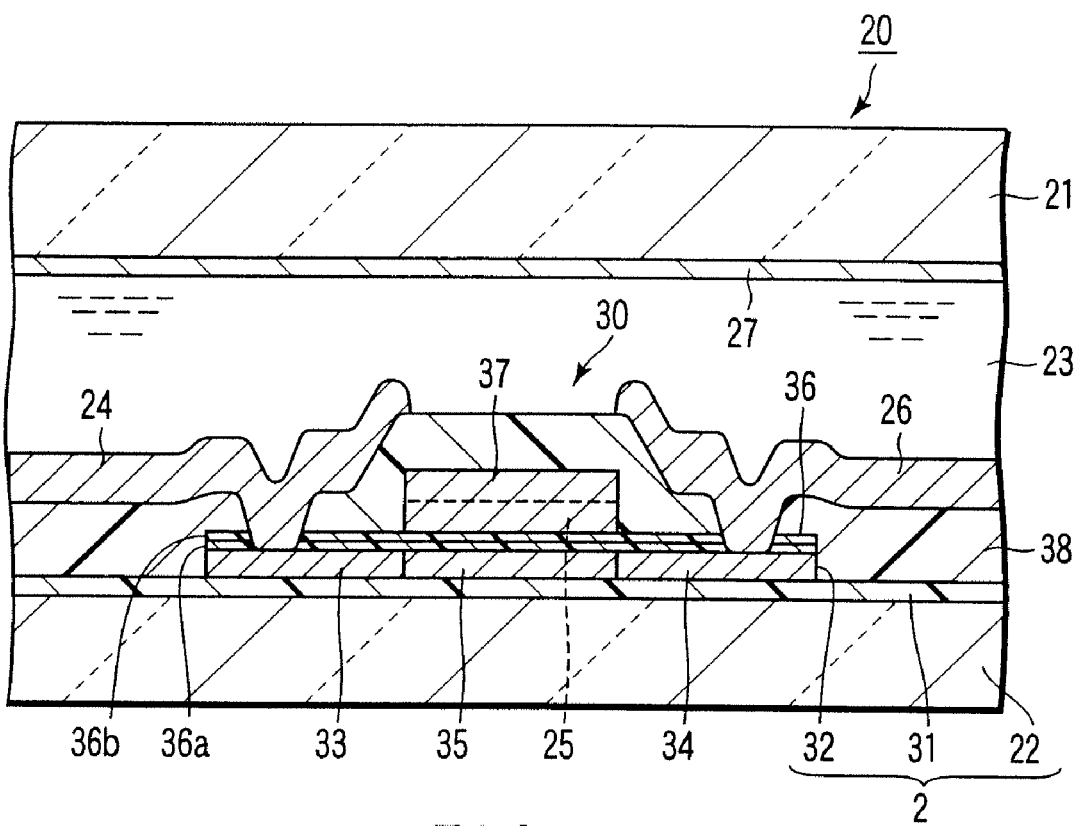
FIG. 11 is a cross sectional view showing the construction of a liquid crystal display device comprising TFTs.

A manufacturing method of a display device comprising a TFT will now be described. Each of FIGS. 10 and 11 shows the construction of a display device 20 such as an active matrix type liquid crystal display device. The display device 20 is called a liquid crystal display device in the following description. Incidentally, a reference numeral 30 shown in FIG. 11 denotes a TFT.

The liquid crystal display device 20 will now be described first. As shown in FIGS. 10 and 11, the liquid crystal display device 20 comprises a pair of transparent substrates 21 and 22, a liquid crystal layer 23 formed in a region surrounded by a sealing material between the transparent substrates 21 and 22, a plurality of pixel electrodes 24 arranged in the row direction and in the column direction on the inner surface of the transparent substrate 22 in a manner to form a matrix, a transparent counter electrode 27 in the form of a single film, which is positioned to face the pixel electrodes 24, a plurality of TFTs 30 arranged to form a matrix and each including a gate insulating film 36 formed by the film-forming method that is to be described herein later, and a scanning line 25 and a signal line 26, which are electrically connected to these TFTs 30. In other words, the liquid crystal display device 20 is constructed such that transistors, e.g., the TFTs 30, used as the pixel selecting elements are arranged to form a matrix.

It is possible to use, for example, a pair of glass substrates as the pair of the transparent substrates 21 and 22. These transparent substrates 21 and 22 are bonded to each other with a frame-shaped sealing material (not shown) interposed therebetween. The liquid crystal layer 23 is arranged in a region surrounded by the sealing material between the pair of the transparent substrates 21 and 22.

A plurality of pixel electrodes 24, a plurality of TFTs 30, the scanning line 25 and the signal line 26 are arranged on the inner surface of the transparent substrate 22 on, for example, the back side. The pixel electrodes 24 are arranged in the row direction and in the column direction so as to form a matrix. The TFTs 30 are electrically connected, respectively, to the plural pixel electrodes 24. Further, the scanning line 25 and the signal line 26 are electrically connected to each of the plural TFTs 30.

The scanning lines 25 are allowed to extend in the column direction of the pixel electrodes 24 and connected, respectively, at the ends on one side to a plurality of scanning line terminals (not shown) formed in the edge portion on one side of the transparent substrate 22 on the back side. Also, the plural scanning line terminals are connected, respectively, to a scanning line driving circuit 41.

On the other hand, the signal lines 26 extend in the row direction of the pixel electrodes 24 and connected, respectively, at the ends on one side to a plurality of signal line terminals (not shown) formed in the edge portion on one side of the transparent substrate 22 on the back side. Also, the plural scanning line terminals are connected, respectively, to a signal line driving circuit 42.

Each of the scanning line driving circuit 41 and the signal line driving circuit 42 is connected to a liquid crystal controller 43. Upon receipt of an image signal and a synchronizing signal supplied from, for example, the outside, the liquid crystal controller 43 generates an image video signal $V_{pix}$, a vertical scanning control signal YCR and a horizontal scanning control signal XCT.

The transparent counter electrode 27 in the form of a single film, which is positioned to face the plural pixel electrodes 24, is formed on the inner surface of another transparent substrate, i.e., the transparent substrate 21 on the front side. Also, it is possible to arrange a color filter on the inner surface of the transparent substrate 21 on the front side in a manner to correspond to a plurality of pixel portions in which the plural pixel electrodes 24 are positioned to face the counter electrode 27. Further, it is possible to form a light shielding film in a manner to correspond to the region between the pixel portions.

A polarizing plate (not shown) is formed on the outside of the pair of the transparent substrates 21 and 22. Also, in a transmission type liquid crystal display device 20, a planar light source (not shown) is formed on the side of the back surface of the transparent substrate 22 on the rear side. Incidentally, it is possible for the liquid crystal display device 20 to be of a reflection type or of a semi-transmitting reflection type.

The construction of the TFT 30, i.e., a semiconductor device, will now be described. A reference numeral 31 shown in FIG. 11 denotes a buffer layer consisting of $SiO_2$ and formed on the transparent substrate 22. A semiconductor layer 32 comprising a source region 33, a drain region 34 and a channel region 35 is formed on the buffer layer 31. A gate electrode 37 consisting of Al is formed on the semiconductor layer 32 with a gate insulating film 36 interposed therebetween. Further, an interlayer insulating film 38 consisting of $SiO_2$ is formed on the entire surface of the transparent substrate 22 including the gate electrode 37.

As shown in FIG. 11, the TFT 30 comprises the transparent substrate 22, the buffer layer 31 formed on the transparent substrate 22, the semiconductor layer 32 including the source region 33, the drain region 34 and the channel region 35, a gate insulating film 36 formed on the semiconductor layer 32 by the film-forming method described herein later and including a silicon oxide layer 36a and an aluminum oxide layer 36b, and a gate electrode 37 formed on the gate insulating film 36.

The manufacturing method of the TFT 30 will now be described. Incidentally, in the manufacturing method described in the following, it is possible to form a plurality of TFTs 30 simultaneously on the transparent substrate 22 on the rear side.

In the first step, a $SiO_2$ film acting as the buffer layer 31 is formed on substantially the entire region of the surface forming the inner surface of the transparent substrate 22 on the rear side. Then, an amorphous silicon (a-Si) film is formed on the buffer layer 31 in a thickness of 100 nm by, for example, a reduced pressure CVD method, followed by applying a dehydrogenation treatment at 450° C. for one hour under a nitrogen gas atmosphere. Further, the a-Si film is crystallized by applying a laser annealing to the a-Si film by using an excimer laser so as to form a polycrystalline silicon layer.

In the next step, the polycrystalline silicon layer is coated by means of a spin coating method with a resist film formed of a photosensitive resin, followed by applying a light exposure and a development to the resist film by the photolithography process so as to form a plurality of semiconductor layers 32 each having a prescribed island shape. Each of these semiconductor layers 32 is formed to correspond to the TFT 30 so as to provide a constituting factor of the corresponding TFT 30. In the next step, the gate insulating film 36 is formed to cover the island-shaped semiconductor layer 32. The method of forming the gate insulating film 36 will be described later.

After formation of the gate insulating film 36, a metal film, e.g., an Al film, which is to be processed into a plurality of gate electrodes 37, is formed on the gate insulating film 36 by means of, for example, a sputtering method, followed by applying a photo-lithography process and an etching process to the metal film so as to process the metal film into the shape of a wiring, thereby forming a plurality of gate electrodes 37. Each gate electrode 37 is formed above the semiconductor layer 32 in a manner to correspond to a single semiconductor layer 32. In other words, each gate electrode 37 is formed to correspond to a single TFT 30 like the semiconductor layer 32, thereby providing a constituting factor of the corresponding TFT 30. Incidentally, it is also possible to form the scanning line 25 in a manner to form an integral structure together with the gate electrode 37.

In the next step, the semiconductor device 32 is doped selectively with an impurity such as phosphorus (P) by means of, for example, an ion implantation. As a result, formed are a semiconductor layer having a low resistivity, which is formed into the source region 33 and the drain region 34, and the channel region 35 into which the impurity is not introduced.

In the next step, a $SiO_2$ film is deposited on the entire surface of the transparent substrate 22 by a plasma CVD method, followed by applying a heat treatment to the $SiO_2$ film at 600° C. so as to form the interlayer insulating film 38.

After formation of the interlayer insulating film 38, contact holes 44 are formed in those portions of the interlayer insulating film 38 which correspond to the source region 33, the drain region 34 and the gate electrode 37 by the photolithography method and the etching method. Further, a metal film that is formed into a source electrode is formed so as to be connected to the source region 33. Also formed is another metal film that is to be formed into a drain electrode so as to be connected to the drain region 34. As a result, a plurality of TFTs 30 are formed. After formation of the TFT 30, the pixel electrode 24 is formed so as to be connected to the source electrode. At the same time, formed is a signal electrode that is electrically connected to the drain electrode.

The gate insulating film 36 is formed by the film-forming method according to the embodiment of the present invention described previously. It follows that the film-forming method of the present invention is applied to a substrate 2 to be processed comprising the transparent substrate 22 having the buffer layer 31 and the island-shaped semiconductor layer 32 formed thereon.

The method of forming the gate insulating film 36 will now be described. In the first step, a $SiO_2$ film is formed in a thickness not smaller than 2 nm, e.g., in a thickness of 2 nm, on substantially the entire region of the substrate 2 to be process by the conventional film-forming method, i.e., a plasma CVD method using a mixed gas consisting of a TEOS gas and an $O_2$ gas, or a low temperature oxidizing method, i.e., a plasma oxidation method or an optical oxidation method. Incidentally, the $SiO_2$ film can be formed by employing the film-forming method according to any of the first to third embodiments of the present invention. Then, an $Al_2O_3$ film is formed on substantially the entire surface of the $SiO_2$ film by employing the film-forming method according to the sixth embodiment of the present invention. Incidentally, it is also possible to form the $Al_2O_3$ film by employing the film-forming method according to the seventh embodiment of the present invention. In other words, the gate insulating film 36 is of a laminate structure consisting of a $SiO_2$ film 36a and an $Al_2O_3$ film 36b. It should be noted that the gate insulating film 36, i.e., the laminate structure consisting of the $SiO_2$ film 36a and the $Al_2O_3$ film 36b, has a dielectric constant larger than that of the conventional gate insulating film ($SiO_2$ film).

The characteristics of the gate insulating film 36 formed of the laminate structure consisting of the $SiO_2$ film 36a and the $A_2o_3$ film 36b were evaluated as follows. In the first step, MOS devices 1) to 3) given below were prepared:

1) A MOS device prepared by forming a $SiO_2$ film on a substrate by the plasma oxidation method, followed by forming an aluminum electrode on the $SiO_2$ film by means of a vapor deposition.

2) A MOS device prepared by forming an $Al_2O_3$ film on a substrate by the film-forming method according to the sixth embodiment of the present invention, followed by forming an aluminum electrode on the $Al_2O_3$ film by means of a vapor deposition.

3) A MOS device prepared by forming a $SiO_2$ film on a substrate by the conventional film-forming method, followed by forming an $Al_2O_3$ film on the $SiO_2$ film by the film-forming method according to the sixth embodiment of the present invention and subsequently forming an aluminum electrode on the $Al_2O_3$ film by means of a vapor deposition.

In the next step, the interface state density of each sample was evaluated by measuring the capacitance-voltage characteristics of each of the MOS devices thus prepared.

Figure 12:
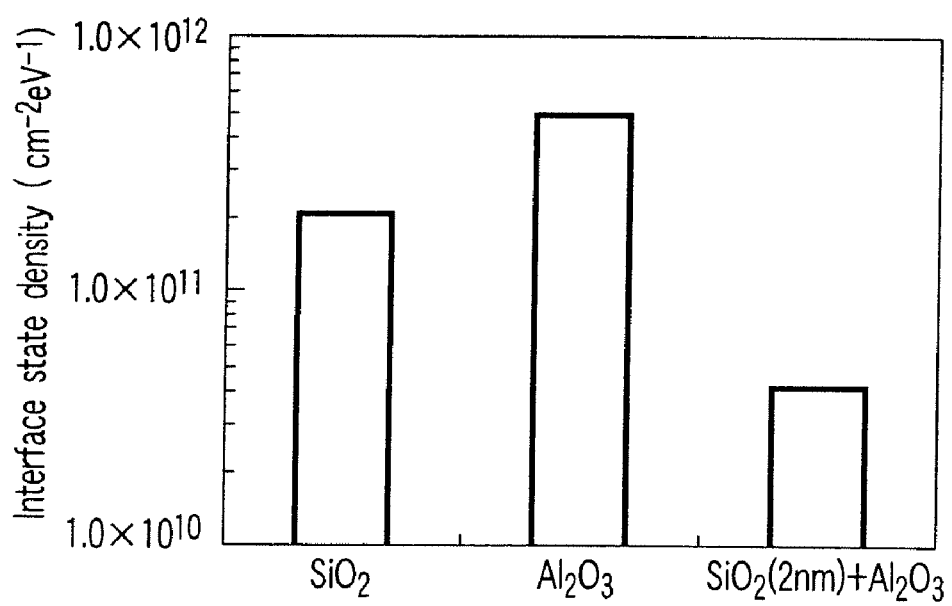
FIG. 12 is a graph showing the interface state density in a $SiO_2$ film formed by the conventional film-forming method, in an $Al_2O_3$ film formed by the film-forming method according to the sixth embodiment of the present invention, and in a laminate film consisting of the $SiO_2$ film formed by the conventional film-forming method and the $Al_2O_3$ film formed on the $SiO_2$ film by the film-forming method according to the sixth embodiment of the present invention.

FIG. 12 is a graph showing the interface state density of each of the MOS devices.

As shown in FIG. 12, in the case where the $Al_2O_3$ film alone is formed on the substrate, the interface state density is rendered higher than that in the case where the $SiO_2$ film alone is formed on the substrate so as to lower the interface characteristics. However, it has been found that the interface state density is lowered in the case where the $SiO_2$ film and the $Al_2O_3$ film are laminated one upon the other on the substrate so as to improve the interface characteristics. It is considered reasonable to understand that the interface state density is lowered in the case where the $SiO_2$ film is formed at the interface with the $Al_2O_3$ film.

It follows that, since the dielectric constant of the gate insulating film 36 can be increased by forming the gate insulating film 36 as described above, the effective thickness of the gate insulating film 36 can be made smaller than that in the conventional device. Also, since the gate insulating capacitance can be increased by forming the gate insulating film 36 as described above, it is possible to increase the ON current of the TFT 30. Further, since the interface state density is low, it is possible to elevate the rising characteristics of the TFT 30. In addition, the gate insulating film 36 can be formed in this embodiment at a temperature lower than that employed in the organometallic gaseous phase growth method such that the damage done to the underlayer can be lowered. Further, the gate insulating film 36 can be formed at a film-forming rate higher than that for the atomic layer depositing method.

As described above, the method of manufacturing a semiconductor device according to the present invention comprises the step of forming the semiconductor layer 32 in at least a part on the surface of the substrate 2 to be processed, the step of laminating the silicon oxide layer ($SiO_2$ layer) 36a on the semiconductor layer 32, the step of supplying into a plasma processing chamber (chamber 11) at least three kinds of gases including an organometallic compound gas (TMA gas), an oxidizing gas, and a rare gas such that the percentage of the partial pressure of the rare gas (Pr) is not smaller than 85%, i.e., $85\% \leq Pr < 100\%$, and the step of generating a plasma within the plasma processing chamber so as to permit the organometallic compound gas and the oxidizing gas to be decomposed by the plasma, thereby laminating an aluminum oxide layer ($Al_2O_3$ film) 36b as a metal oxide film on the silicon oxide layer 36a. It follows that, according to the manufacturing method of the semiconductor device outlined above, it is possible to form an insulating film, which has a high dielectric constant and is low in oxygen deficiency, easily, and at a low cost. Also, the manufacturing method of the semiconductor device defined in the present invention makes it possible to decrease the thickness of the insulating film. According to the manufacturing method of the semiconductor device, the electron density within the plasma processing chamber can be markedly higher than that in the conventional method, with the result that the decomposition of the organometallic compound gas and the oxidizing gas is promoted.

The present invention also provides a manufacturing method of a display device including a plurality of TFTs 30 arranged on the substrate 2 to be processed in a manner to form a matrix, comprising the step of forming a plurality of semiconductor layers 32 for forming a plurality of TFTs 30 on the substrate 2 to be processed, the step of laminating the silicon oxide layer 36a on the semiconductor device 32, the step of supplying into a plasma processing chamber (chamber 11) at least three kinds of gases including an organometallic compound gas (TMA gas), an oxidizing gas, and a rare gas such that the percentage of the partial pressure of the rare gas (Pr) is not smaller than 85%, i.e., $85\% \leq Pr < 100\%$, and the step of generating a plasma within the plasma processing chamber so as to permit the organometallic compound gas and the oxidizing gas to be decomposed by the plasma, thereby laminating an aluminum oxide layer ($Al_2O_3$ film) 36b providing a metal oxide film on the silicon oxide layer 36a. It follows that, according to the manufacturing method of the display device defined in the present invention, it is possible to form an insulating film, which has a high dielectric constant and is low in oxygen deficiency, easily, and at a low cost. Also, the manufacturing method of the display device defined in the present invention makes it possible to decrease the thickness of the insulating film. According to the manufacturing method of the display device, the electron density within the plasma processing chamber can be markedly higher than that in the conventional method, with the result that the decomposition of the organometallic compound gas and the oxidizing gas is promoted.

Further, the manufacturing method of the semi-conductor device according to the present invention comprises the step of forming the semiconductor layer 32 in at least a part on the surface of the substrate 2 to be processed, the step of laminating the silicon oxide layer ($SiO_2$ layer) 36a on the semiconductor layer 32, the step of supplying into a plasma processing chamber (chamber 11) at least three kinds of gases including an organometallic compound gas (TMA gas), an oxidizing gas, and a hydrogen gas, and the step of generating a plasma within the plasma processing chamber so as to permit the organometallic compound gas and the oxidizing gas to be decomposed by the plasma, thereby laminating an aluminum oxide layer ($Al_2O_3$ film) 36b providing a metal oxide film on the silicon oxide layer 36a. It follows that, according to the manufacturing method of the semiconductor device outlined above, it is possible to form an insulating film, which has a high dielectric constant and is low in oxygen deficiency, easily, and at a low cost. Also, the manufacturing method of the semiconductor device defined in the present invention makes it possible to decrease the thickness of the insulating film. According to the manufacturing method of the semi-conductor device, a reaction takes place between the hydrogen gas and the oxidizing gas, producing oxygen atoms efficiently.

The manufacturing method of the semiconductor device can be employed for manufacturing a semi-conductor device such as a thin film transistor (TFT) of a metal oxide semiconductor device (MOS device).

Still further, the present invention provides a manufacturing method of a display device including a plurality of TFTs 30 arranged on the substrate 2 to be processed in a manner to form a matrix, comprising the step of forming a plurality of semiconductor layers 32 for forming a plurality of TFTs 30 on the substrate 2 to be processed, the step of laminating the silicon oxide layer 36a on the semiconductor device 32, the step of supplying into a plasma processing chamber (chamber 11) at least three kinds of gases including an organometallic compound gas (TMA gas), an oxidizing gas, and a hydrogen gas, and the step of generating a plasma within the plasma processing chamber so as to permit the organometallic compound gas, the oxidizing gas, and the hydrogen gas to be decomposed by the plasma, thereby laminating an aluminum oxide layer ($Al_2O_3$ film) 36b providing a metal oxide film on the silicon oxide layer 36a. It follows that, according to the manufacturing method of the display device, it is possible to form an insulating film, which has a high dielectric constant and is low in oxygen deficiency, easily, and at a low cost. Also, the manufacturing method of the display device defined in the present invention makes it possible to decrease the thickness of the insulating film.

Incidentally, in each of the manufacturing method of the semiconductor device and the manufacturing method of the display device described above, it is desirable to laminate the silicon oxide layer having a thickness of at least 2 nm. In this case, the dielectric constant of the film can be increased satisfactorily. According to the manufacturing method of the display device, the electron density within the plasma processing chamber can be markedly higher than that in the conventional method, with the result that the decomposition of the organometallic compound gas and the oxidizing gas is promoted.

The manufacturing method of the display device can be employed for manufacturing a display device such as a liquid crystal display device, an organic EL display device, or an inorganic EL display device.

Also, the metal oxide film for forming the gate insulating film 36 is not limited to an aluminum oxide film. Further, the metal oxide film need not be formed in a manner to overlap completely with the silicon oxide layer 36a. Still further, the forming region of the metal oxide film can be selected optionally.

The technical scope of the present invention is not limited to the specific embodiments described above. Of course, the present invention can be modified in various fashions within the technical scope of the present invention.

According to the present invention, it is possible to obtain a film-forming method that permits forming a film low in the oxygen deficiency easily at a low cost, to obtain a method of manufacturing a semiconductor device, to obtain a semiconductor device, to obtain a method of manufacturing a display device, and to obtain a display device.

The invention claimed is:

1. A film-forming method comprising:
   supplying into a plasma processing chamber at least three kinds of gases including a silicon compound gas, an oxidizing gas, and a rare gas, the percentage of the partial pressure of the rare gas (Pr) based on the total pressure being not smaller than 85%, i.e., 85% $\leq Pr < 100\%$; and
   generating a plasma within the plasma processing chamber so as to form a film of silicon oxide on a substrate to be processed,
   wherein the silicon compound gas is provided by a silane gas, and the oxidizing gas includes at least one selected from the group consisting of an oxygen gas and an ozone gas.

2. The film-forming method according to claim 1, wherein the plasma generated within the plasma processing chamber is a surface wave plasma.

* * * * *